(12) United States Patent
Toba

(10) Patent No.: US 7,183,635 B2
(45) Date of Patent: Feb. 27, 2007

(54) SEMICONDUCTOR DEVICE HAVING A LOW-RESISTANCE BUS INTERCONNECT, METHOD OF MANUFACTURING SAME, AND DISPLAY APPARATUS EMPLOYING SAME

(75) Inventor: Tamaki Toba, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 11/086,338

(22) Filed: Mar. 23, 2005

(65) Prior Publication Data
US 2005/0232045 A1  Oct. 20, 2005

(30) Foreign Application Priority Data
Mar. 31, 2004 (JP) ............................. 2004-102023

(51) Int. Cl.
*H01L 23/02* (2006.01)

(52) U.S. Cl. ....................... 257/678; 257/49

(58) Field of Classification Search ............... 257/49, 257/678

See application file for complete search history.

(56) References Cited

FOREIGN PATENT DOCUMENTS

| | | |
|---|---|---|
| JP | 3033123 B | 1/1992 |
| JP | 2002-303878 | 10/2002 |
| JP | 2003-029292 | 1/2003 |
| JP | 2003-100982 | 4/2003 |

*Primary Examiner*—Long Pham
(74) *Attorney, Agent, or Firm*—Dickstein, Shapiro, LLP.

(57) ABSTRACT

A semiconductor device for being mounted on the display panel board of a display apparatus includes a substrate; a plurality of circuit units disposed on the substrate and including thin-film transistors, the circuit units having respective output terminals; at least one bus interconnect for supplying a voltage to the circuit units; and a power supply feed point for supplying a voltage from an external source to the bus interconnect. The pitch L (m) of the circuit units, the number N of the circuit units, and the resistance R (Ω/m) per unit length of the at least one bus interconnect are related to each other as follows:

$R \times N^2 \times L \leq 4 \times 10^3$.

12 Claims, 5 Drawing Sheets

SEMICONDUCTOR DEVICE HAVING A LOW-RESISTANCE BUS INTERCONNECT, METHOD OF MANUFACTURING SAME, AND DISPLAY APPARATUS EMPLOYING SAME

BACKGROUND OF THE INVENTION

1. Field of the Invention

The present invention relates to a semiconductor device, a method of manufacturing the semiconductor device, and a display apparatus incorporating the semiconductor device, and more particularly to a semiconductor device having a low-resistance bus interconnect, a method of manufacturing the semiconductor device, and a display apparatus incorporating the semiconductor device.

2. Description of the Related Art

Liquid crystal displays (LCDs) are incorporated in various portable devices including cellular phone sets, PDAs (Personal Digital Assistants), note-book personal computers, etc. because the LCDs are low in profile and light in weight. For medium- and large-size LCDs such as television LCDs to find wider use, however, they need to be lower in cost, particularly, the packaging cost for driver semiconductor devices for driving liquid crystal cells needs to be lower.

Heretofore, driver semiconductor devices for medium- and large-size LCDs have been packaged according to the TAB (Tape Automated Bonding) process. The TAB process is a process of connecting one side of output terminals of a TCP (Tape Carrier Package), which comprises a single semi-conductor device mounted on a single flexible board, to a signal input section of an LCI panel board. Medium- and large-size LCDs are required to be combined with ten to twenty driver semiconductor devices. The individual driver semiconductor devices have to be successively supplied with input signals and power supply voltages for driving liquid crystal cells from outside of the LCD. Therefore, a printed circuit board having a plurality of bus interconnects thereon is connected to one side of input terminals of each TCP. The input signals and power supply voltages are supplied from the bus interconnects on the printed circuit board through bus interconnects on the TCPs to the individual drive semiconductor devices. To the printed circuit board, there is connected a flexible board, other than the TCPs, for supplying the input signals and power supply voltages.

The medium- and large-size LCDs need the ten to twenty driver semiconductor devices for the following reasons: An LCD comprises a two-dimensional array of pixels arranged in rows and columns which extend perpendicularly to each other. At present, the matrix of pixels that makes up medium- and large-size LCDs is primarily an XGA (Extended Graphics Array) having vertically spaced 768 rows and horizontally spaced 1024 columns. For displaying color images, an XGA panel is made up of vertically spaced rows of 768 dots and horizontally spaced columns of 3072 dots because three dots corresponding to three primaries are arranged in a horizontal array as one pixel. On active-matrix liquid crystal panels, each dot is associated with a thin-film transistor (TFT). A voltage is applied to a gate line extending along a row to turn on the TFTs that are connected to the row, and a signal voltage is applied from a source line extending along a column to one of the TFTs that are turned on, energizing the corresponding dot to display an image.

For displaying an image on an XGA panel, therefore, it is necessary for one or more gate driver semiconductor devices to have output terminals corresponding to 768 gate lines and for one or more source driver semiconductor devices to have output terminals corresponding to 3072 source lines. If a gate driver semiconductor device having 768 output terminals could be constructed as a single semiconductor chip and a source driver semiconductor device having 3072 output terminals could be constructed as a single semiconductor chip, then an XGA panel requires only two semiconductor devices (one gate driver semiconductor device and one source driver semiconductor device). However, such semiconductor devices are not presently available in the art because their chip size is too large.

According to the present practical application of packaging technology, the minimum pitch that allows packaging at production sites is of about 40 μm. That is, for achieving reliable connections through outer lead bonding and inner lead bonding, each terminal needs a width of 40 μm or more. If a source driver semiconductor device having 3072 output terminals is constructed as a single chip, then the dimension of a longitudinal side of the chip is 40 μm×3072=123 mm, which makes the chip too large to be practically formed on a single-crystal silicon substrate. For this reason, general driver semiconductor devices available in the market have 200 to 400 output terminals. At present, most XGA panels have a total of 11 driver semiconductor devices including 3 gate driver semiconductor devices each having 256 output terminals and 8 source driver semiconductor devices each having 384 output terminals.

Since ten to twenty TCPs, one or two flexible boards, and one or two printed circuit boards are required according to the TAB process, the cost of the parts and the cost required to package those parts are responsible for an increase in the manufacturing cost of LCDs.

One way of reducing the packaging cost of LCD driver semiconductor devices is a COG (Chip On Glass) process that has begun to be used in practical applications instead of the TAB process (see, for example, Japanese laid-open patent publication No. 2003-100982). The COG process is a process of mounting a driver semiconductor device as a bare chip directly on an LCD panel board without the need for an TCP. Specifically, the circuit surface of a driver semiconductor device is pressed with heat against the LCD panel board. At this time, an adhesive tape of synthetic resin with electrically conductive particles dispersed therein is sandwiched between protrusive output terminals, ten to twenty μm high, on the circuit surface of the driver semiconductor device and input terminals on the LCD panel board. Only those areas of the adhesive tape which are pressed between the terminals are rendered electrically conductive, thus electrically interconnecting the terminals. Even when the COG process is employed, bus interconnects are required to successively connect individual driver semiconductor devices. To meet such a requirement, Japanese laid-open patent publication No. 2003-100982 discloses a process of forming parallel bus interconnects on an LCD panel board and a driver semiconductor device to lower the interconnect resistance for minimizing flexible boards and printed circuit boards, thereby to allow an LCD to be assembled at a low cost.

Simply replacing the TAB process with the COG process is unable to reduce the number of driver semiconductor devices installed on an LCD panel board through thee COG process is expected to reduce the number of flexible boards and printed circuit boards. According to a proposed process of the number of installed driver semiconductor devices, thin-film transistors are formed on two slender glass boards which are as long as two respective perpendicular sides of an LCD panel board, producing a gate driver semiconductor device and a source driver semiconductor device, and those semiconductor devices are mounted on the LCD panel board in the same manner as the COG process, thereby assembling a liquid crystal display unit at a lower cost (see, for example, Japanese patent No. 3033123). As described above, if each of the gate and source driver semiconductor devices is fabricated on a single-crystal silicon substrate, it is unpractical to form a driver semiconductor device having a few thousand output terminals on a single chip due to dimensional limitations on silicon substrates. However, glass substrates are much less subject to such dimensional limitations because they can be produced in sizes sufficiently larger than silicon substrates. If a driver semiconductor device is formed on a glass substrate, then it is possible to fabricate a driver semiconductor device of greater dimensions which has more output terminals, and it is expected that LCDs can be assembled at a lower cost using such a driver semiconductor device.

The driver semiconductor device on the glass substrate is still problematic, however, in that on the driver semiconductor device of greater dimensions which has more output terminals, voltage drops developed in bus interconnects manifest themselves, tending to increase variations in voltages supplied to a plurality of drive circuit units for supplying voltages to gate lines and source lines on an LCD panel board. For example, if an image is to be displayed on an LCD with a single large-size driver semiconductor device, then voltage drops developed in power supply bus interconnects in the driver semiconductor device are liable to produce a large difference between the voltage supplied to the drive circuit unit that is closest to a power supply feed point and the voltage supplied to the drive circuit unit that is farthest from the power supply feed point. Such a large difference between the voltages supplied to individual drive circuit units fails to keep a desired level of displayed image quality because of a gradation shift displayed on the LCD, and, in some cases, prevents pixels connected to the driver circuit from being displayed.

Therefore, if a large-size driver semiconductor device which is capable of driving medium- and large-size LCDs alone is to be used, then either low-resistance bus interconnects have to be formed in the driver semiconductor device or on the LCD panel board, or an LCD panel board with low-resistance interconnects have to be additionally connected to the driver semiconductor device.

For example, a bus interconnect having a resistance of 5 Ω/m per unit length is required to realize a driver semiconductor device which has 3000 drive circuit units formed across a width of 250 mm. It is assumed that a power supply feed point is disposed at one end of the driver semiconductor device, and the bus interconnect extends from that one end to the other of the driver semiconductor device. The resistance R per unit length of the bus interconnect can be expressed as R=ρ/A, where ρ represents the volume resistivity of the bus interconnect (Ω·m) and A represents the cross-sectional area of the bus interconnect ($m^2$). If the bus interconnect is made of Au, then since the volume resistivity of Au at room temperature is about $2.3 \times 10^{-8}$ Ω·m, the bus interconnect is required to have a cross-sectional area of 4600 $\mu m^2$ in order for the bus interconnect to have the resistance R of 5 Ω/m. Therefore, if a bus interconnect having a width of 200 μm is formed and its resistance R is to be equal to or less than 5 Ω/m, then the bus interconnect has to have a thickness of 23 μm or greater.

Generally, interconnects in driver semiconductor devices or on LCD panel boards are formed by vacuum evaporation or sputtering, and are difficult to have low resistances. The thickness of a film that can be deposited by vacuum evaporation or sputtering is limited to about 1 μm at maximum. Consequently, if an aluminum interconnect having a width of 500 μm and a thickness of 1 μm, for example, is formed, on the assumption that the volume resistivity of aluminum is $2.78 \times 10^{-8}$ Ω·m, then the aluminum interconnect has a high resistance of about 56 Ω/m per unit length. When a thicker aluminum film is formed, the substrate or board may be warped, the film may be peeled off, and the surface configuration may be impaired, due to internal stresses of the film, making it difficult to perform subsequent manufacturing processes.

The thicker bus interconnects present an obstacle to efforts to package a semiconductor device in the same manner as the COG process. This is because packaging a semiconductor device in the same manner as the COG process requires that structural bodies on the semiconductor device substrate be essentially of the same height.

SUMMARY OF THE INVENTION

It is an object of the present invention to provide a semiconductor device of increased dimensions which has a low-resistance bus interconnect, thin film transistors, and a number of output terminals.

Another object of the present invention is to provide a method of manufacturing a semiconductor device having a low-resistance bus interconnect, easily at a low cost.

Still another object of the present invention is to provide a low-cost display apparatus which has a panel board mounting thereon a semiconductor device having a low-resistance bus interconnect.

To achieve the first-mentioned object, there is provided in accordance with the present invention a semiconductor device comprising a substrate, a plurality of circuit units disposed on the substrate and including thin-film transistors, the circuit units having respective output terminals, at least one bus interconnect for supplying a voltage to the circuit units, and a power supply feed point for supplying a voltage from an external source to the bus interconnect, wherein the pitch L (m) of the circuit units, the number N of the circuit units, and the resistance R (Ω/m) per unit length of the at least one bus interconnect are related to each other as follows:

$$R \times N^2 \times L \leq 4 \times 10^3$$

The pitch L (m) of the circuit units, the number N of the circuit units, and the resistance R (Ω/m) per unit length of the at least one bus interconnect may be related to each other as follows:

$$R \times N^2 \times L \leq 16 \times 10^3$$

According to the present invention, there is also provided a display apparatus comprising a semiconductor device of the structure described above and a display panel board on which the semiconductor device is mounted.

According to the present invention, there is also provided a method of manufacturing a semiconductor device of the structure described above by simultaneously forming at least a portion of the bus interconnect and at least a portion of the output terminals.

Even if the semiconductor device according to the present invention has a large length, the difference between the input resistance of the circuit unit which is closest to the power supply feed point and the input resistance of the circuit unit which is remotest from the power supply feed point is small, e.g., 1 kΩ or less.

Since in the display apparatus according to the present invention, the aforementioned semiconductor device is mounted on a TFT board according to a process similar to the COG process, the display apparatus is low in cost even if it is large in size, and can display images with excellent quality free of display irregularities.

In the method of manufacturing the semiconductor device according to the present invention, because the output terminals and the bus interconnect are simultaneously formed, they can be formed to substantially the same height. Even if the bus interconnected is formed so as to have a low resistance, the semiconductor device can be mounted according to a process similar to the COG process. Therefore, the semiconductor device can be manufactured at a low cost.

If the bus interconnect is constructed to have a plurality of regions having different heights from the surface of the substrate, then the generation of voids in an adhesive is suppressed when the semiconductor device is mounted on the TFT board, and hence the semiconductor device can be mounted on the TFT board with excellent reliability according to a process similar to the COG process.

The above and other objects, features, and advantages of the present invention will become apparent from the following description with reference to the accompanying drawings which illustrate examples of the present invention.

DESCRIPTION OF THE PREFERRED EMBODIMENTS

Figure 1:
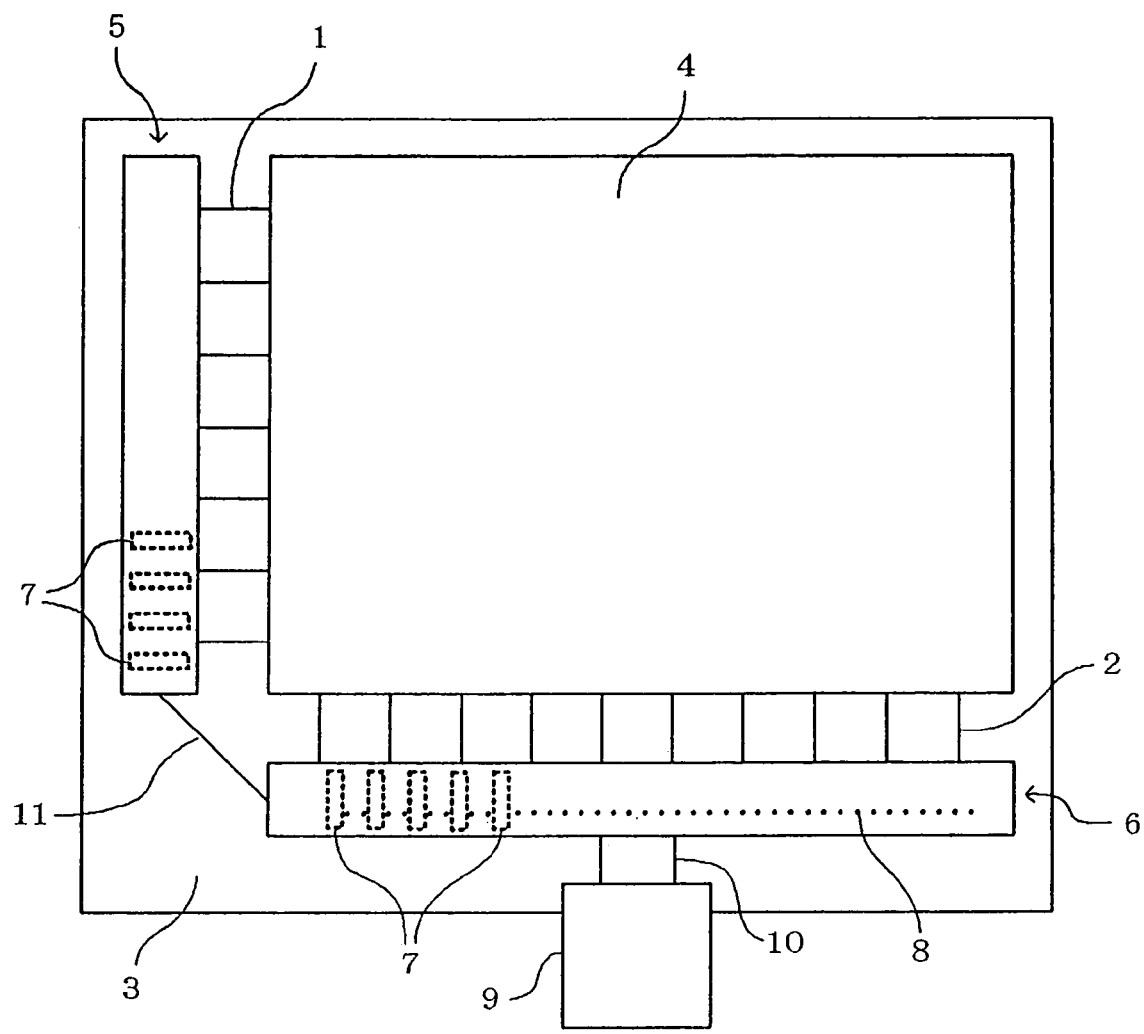
FIG. 1 is a plan view of a liquid crystal display apparatus according to an embodiment of the present invention.

FIG. 1 shows in plan a liquid crystal display apparatus according to an embodiment of the present invention. As shown in FIG. 1, the liquid crystal display apparatus includes TFT board 3 having TFTs (not shown) disposed at points of intersection between a plurality of gate lines 1 along rows and a plurality of source lines 2 along columns, counter board 4 facing the region of TFT board 3 where the TFTs are disposed, and a liquid crystal layer (not shown) sandwiched between TFT board 3 and counter electrode 4. A counter electrode (not shown) is disposed on the surface of counter board 4 which faces TFT board 3. A color filter may be disposed on the surface of the counter electrode. TFT board 3 has two shelves near two perpendicular sides thereof which support thereon gate driver semiconductor device 5 for turning on and off the TFTs and source driver semiconductor device 6 for inputting an image signal. Each of gate driver semiconductor device 5 and source driver semiconductor device 6 has drive circuit units 7 each comprising TFTs having a semiconductor layer of polysilicon and mounted on a glass substrate. Source driver semiconductor device 6 has low-resistance bus interconnect 8. If necessary, gate driver semiconductor device 5 may have a low-resistance bus interconnect.

In the embodiment illustrated in FIG. 1, the liquid crystal display apparatus has one gate driver semiconductor device 5 and one source driver semiconductor device 6. However, it is possible to have a plurality of gate driver semiconductor devices and a plurality of source driver semiconductor devices mounted on TFT board 3. In such a modification, a desired number of driver semiconductor devices may be mounted on areas of TFT board 3 near all the four sides thereof or areas of TFT board 3 near three of the four sides thereof. Each of the gate driver semiconductor devices and the source driver semiconductor devices should preferably have at least 500 drive circuit units.

TFT board 3 also supports thereon flexible board 9 for supplying signal voltages and a power supply voltage, at a position facing a substantially longitudinally central region of source driver semiconductor device 6. Flexible board 9 and source driver semiconductor device 6 are electrically connected to each other by source driver semiconductor device input interconnects 10 formed on TFT board 3. Gate driver semiconductor device 5 is supplied with a clock signal, a control signal, and a power supply voltage from flexible board 9 through gate driver semiconductor device input interconnect 11 formed between source driver semiconductor device 6 and gate driver semiconductor device 5, and bus interconnect 8 of source driver semiconductor device 6. A signal supply point and a power supply feed point for supplying the signal and the power supply voltage to source driver semiconductor device 6 may be positioned anywhere as desired, but should preferably be disposed in the substantially longitudinally central region of source driver semiconductor device 6. This arrangement allows bus interconnect 8 to have a highest resistance and hence to be formed with ease.

Figure 2:
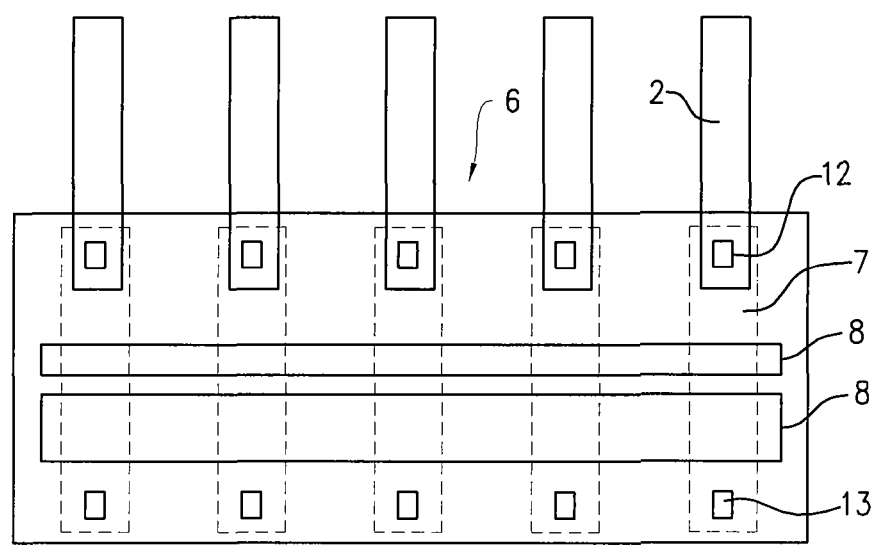
FIG. 2 is a plan view of a semiconductor device incorporated in the liquid crystal display apparatus shown in FIG. 1.

FIG. 2 shows in plan details of source driver semiconductor device 6 shown in FIG. 1. Source driver semiconductor device 6 has 500 to 5000 drive circuit units 7 for outputting image signal voltages to the TFTs in corresponding pixels. Each of drive circuit units 7 has at least one output terminal 12. At least one low-resistance bus interconnect 8 extends along substantially the entire width of source driver semiconductor device 6, i.e., in the longitudinal direction of source driver semiconductor device 6. Source driver semiconductor device 6 should desirably have such a circuit arrangement that at least one input terminals of respective drive circuit units 7 are electrically connected to low-resistance bus interconnect 8 and arranged in an array therealong. While low-resistance bus interconnect 8 is formed along substantially the entire width of source driver semiconductor device 6, low-resistance bus interconnect 8 may not necessarily be continuous, but may be divided into two sections near the power supply feed point. Source driver semiconductor device 6 has at least one low-resistance bus interconnect 8 ranging from 1 to 60 low-resistance bus interconnects 8. In FIG. 2, only two low-resistance bus interconnects 8 are illustrated for the sake of brevity.

The resistance of bus interconnect 8 will be described below. N drive circuit units 7 are arrayed at a pitch of L (m) and have input terminals electrically connected to bus interconnect 8. It is assumed that of N drive circuit units 7, a maximum of N/2 drive circuit units 7 operate simultaneously. If constant current i flows into each of drive circuit units 7, then the difference Z between the input resistance of drive circuit unit 7 which is closest to the power supply feed point on bus interconnect 8 and the input resistance of Nth drive circuit unit 7 from the power supply feed point is maximized when every other drive circuit unit 7 operates. In this case, a voltage drop developed between the input terminal of Nth drive circuit unit 7 from the power supply feed point and the input terminal of (N−2)th drive circuit unit 7 from the power supply feed point is represented by 2LR×i, a voltage drop developed between the input terminal of (N−2)th drive circuit unit 7 from the power supply feed point and the input terminal of (N−4)th drive circuit unit 7 from the power supply feed point is represented by 2LR×2i, and a voltage drop developed between the input terminal of (N−4)th drive circuit unit 7 from the power supply feed point and the input terminal of (N−6)th drive circuit unit 7 from the power supply feed point is represented by 2LR×3i. Thus, a voltage drop developed between the input terminals of two adjacent ones of drive circuit units 7 in operation increases according to an arithmetic series toward the power supply feed point. Therefore, the difference Z between the input resistance of drive circuit unit 7 which is closest to the power supply feed point on bus interconnect 8 and the input resistance of Nth drive circuit unit 7 from the power supply feed point can be expressed as $Z = R \times (N/2) \times [(N/2)-1] \times L$, where R (Ω/m) represents the resistance per unit length of bus interconnect 8 and L(m) represents the pitch of drive circuit units 7. If each of nect and L(m) represents the pitch of drive circuit units 7. If each of the driver semiconductor devices of the liquid crystal display apparatus is constructed as one chip, then since N is considered to be 500 or more, (N/2)−1 can be regarded as (N/2)−1≈N/2. Consequently, if the power supply feed point is disposed at one end of the driver semiconductor device and bus interconnect 8 extends from that one end to the other end of the driver semiconductor device, then the difference Z between the input resistance of drive circuit unit 7 which is closest to the power supply feed point and the input resistance of Nth drive circuit unit 7 which is remotest from the power supply feed point is represented by $Z = R \times (N^2/4) \times L$.

The maximum current that is supplied to each of drive circuit units 7 is in the range from 10 to 100 μA, and an allowable value for the maximum difference between the voltages supplied to drive circuit units 7 (the voltage drop developed between the input terminal of the drive circuit unit closest to the power supply feed point and the input terminal of the Nth drive circuit unit remotest from the power supply feed point) is about 10 mV. Therefore, the allowable value for the input resistance difference Z is in the range from 100 Ω to 1 kΩ. The allowable value for the maximum difference between the voltages supplied to drive circuit units 7 is assumed to be equal to a minimum gradation voltage for displaying 8-bit gradations on the liquid crystal display apparatus. Stated otherwise, for the driver semiconductor devices to prevent displayed image irregularities in the 8-bit gradation display, the maximum input resistance difference between drive circuit units 7, i.e., the difference Z between the input resistance of drive circuit unit 7 closest to the power supply feed point and Nth drive circuit unit 7 remotest from the power supply feed point is required to be 1 kΩ or less. By setting resistance R of the bus interconnect so as to satisfy the following equation (1), if the power supply feed point is located at one end of bus interconnect 8, variations in the voltages supplied to individual drive circuit units 7 can sufficiently be reduced:

$$R \times N^2 \times L \leq 4 \times 10^3 \quad (1)$$

If the equation (1) is satisfied, then the liquid crystal display apparatus can display images of excellent quality regardless of how wide source driver semiconductor device 6 may be.

If the power supply feed point and the signal supply point are positioned centrally across the width of source driver semiconductor device 6 to supply the power supply voltage and the signals to both sides of the power supply feed point and the signal supply point, then drive circuit unit 7 which is farthest from the power supply feed point and the signal supply point is positioned as (N/2)th drive circuit unit 7 from closest drive circuit unit 7. Consequently, the allowable resistance of bus interconnect 8 may be four times greater than if the power supply feed point and the signal supply point are positioned at ends of bus interconnect 8. That is, resistance R of bus interconnect 8 may satisfy the following equation (2):

$$R \times N^2 \times L \leq 16 \times 10^3 \quad (2)$$

The thickness of low-resistance bus interconnect 8 (the height from the surface of TFT board 3 to the upper surface of bus interconnect 8) and the height of output terminals 12 (the height from the surface of TFT board 3 to the upper surface of output terminals 12) should preferably be equal to each other. The thickness of low-resistance bus interconnect 8 is in the range from 2 to 100 μm. Each of drive circuit units 7 has dummy terminal 13 disposed on glass substrate 14 and positioned remotely from output terminal 12, dummy terminal 13 having substantially the same height as output terminal 12. Dummy terminal 13 is a structural body not involved in electric connections, and has a function to keep the driver semiconductor device and TFT board 3 parallel to each other when the driver semiconductor device is installed on TFT board 3. Dummy terminal 13 may be dispensed with if low-resistance bus interconnect 8 is designed to perform the function of dummy terminal 13. Source driver semiconductor device 6 has a width ranging from 25 to 500 mm. The structural details of source driver semiconductor device 6 shown in FIG. 2 are also applicable to gate driver semiconductor device 5.

Output terminals 12 of respective drive circuit units 7 are electrically connected to corresponding source lines 2 on TFT board 3 by an anisotropic conductive film (ACF) or an anisotropic conductive paste (ACP). Alternatively, output terminals 12 may be electrically connected to corresponding source lines 2 according to an electrically connecting technique using a non-conductive paste (NCP). The base resin material of such adhesives should preferably be a photosetting resin material rather than a thermosetting resin material. If an adhesive including a thermosetting resin material as a base is used, then the base should preferably be an acrylic resin material having a lower setting temperature than an epoxy resin material. If an adhesive including a photosetting resin material as a base is used, then it should preferably be cured when irradiated by a dose ranging from 10 to 3000 mJ/cm². If an adhesive including a thermosetting resin material as a base is used, then it should preferably be cured at a bonding temperature ranging from 120 to 220° C. when heated for a period of time ranging from 3 to 30 seconds. Source driver semiconductor device input interconnects 10 and flexible board 9 may be electrically connected to each other at the same time that output terminals 12 of drive circuit units 7 and source lines 2 are electrically connected to each other. Output terminals 12 and low-resistance bus interconnect 8 are formed by either one of an electrolytic plating process, an electroless plating process, a screen printing process for printing a conductive paste, a printing process for spraying a conductive paste, a process of applying and then etching a conductive film, and a process of applying and then etching a metal foil.

Figure 3:
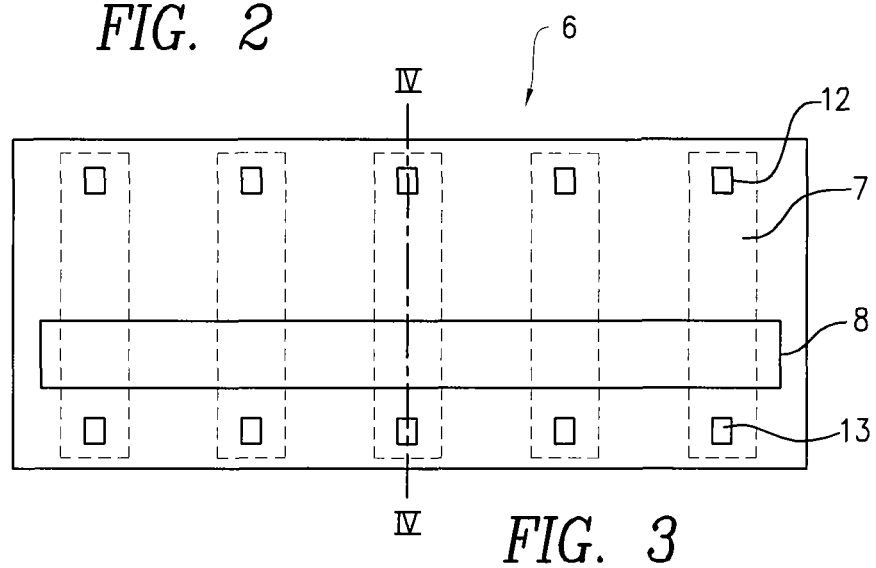
FIG. 3 is a plan view of a first example of the semiconductor device according to the present invention.

First Example of Semiconductor Device:

FIG. 3 shows in plan a first example of the semiconductor device according to the present invention, which serves as part of the liquid crystal display apparatus shown in FIG. 1. The semiconductor device shown in FIG. 3 is a specific example of source driver semiconductor device 6 shown in FIG. 2. Those parts shown in FIG. 3 which are identical to those shown in FIG. 2 are denoted by identical reference numerals and will not be described in detail below.

As shown in FIG. 3, source driver semiconductor device 6 has an array of 3072 drive circuit units 7. However, only five drive circuit units 7 are shown for the sake of brevity. Drive circuit units 7 are arrayed at a pitch of 80 µm. If the power supply feed point and the signal supply point are positioned centrally across the width of source driver semiconductor device 6 to supply the power supply voltage and the signals to both sides of the power supply feed point and the signal supply point, then the maximum resistance per unit length which is allowed for bus interconnect 8 is 21 Ω/m according to the equation (2). Therefore, if bus interconnect 8 is made of Au whose volume resistivity at room temperature is $2.3 \times 10^{-8}$ Ω·m, then the required thickness thereof when the width of bus interconnect 8 is 100 µm is 11 µm or greater. Inasmuch the height of output terminals 12 which is required to mount the driver semiconductor device in the same manner as the COG process is 17 µm, the thickness of bus interconnect 8 may be set to 17 µm, and bus interconnect 8 may be formed simultaneously with output terminals 12.

In the first example, low-resistance bus interconnect 8, output terminals 12, and dummy terminals 13 of source driver semiconductor device 6 were simultaneously formed according to the electrolytic Au plating process.

Figure 4:
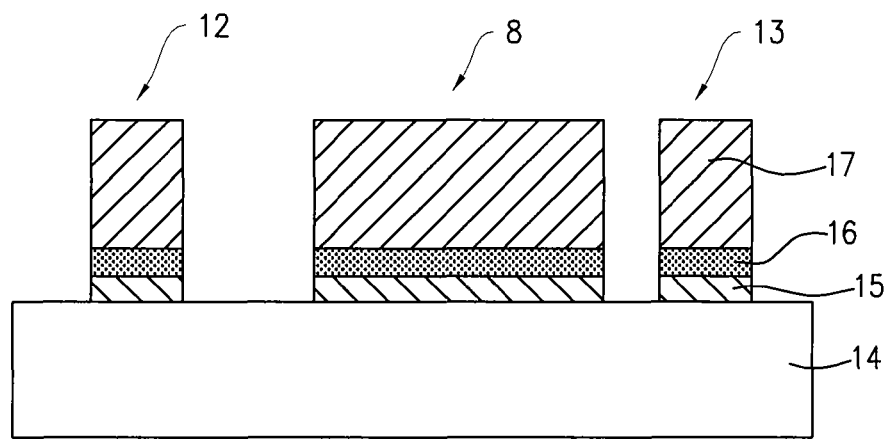
FIG. 4 is a cross-sectional view taken along line IV—IV of FIG. 3.

FIG. 4 is a cross-sectional view taken along line IV—IV of FIG. 3. Those parts shown in FIG. 4 which are identical to those shown in FIG. 3 are denoted by identical reference numerals and will not be described in detail below.

A method of manufacturing the semiconductor device shown in FIGS. 3 and 4 will be described below with reference to FIG. 4 and a flowchart shown in FIG. 5.

Figure 5:
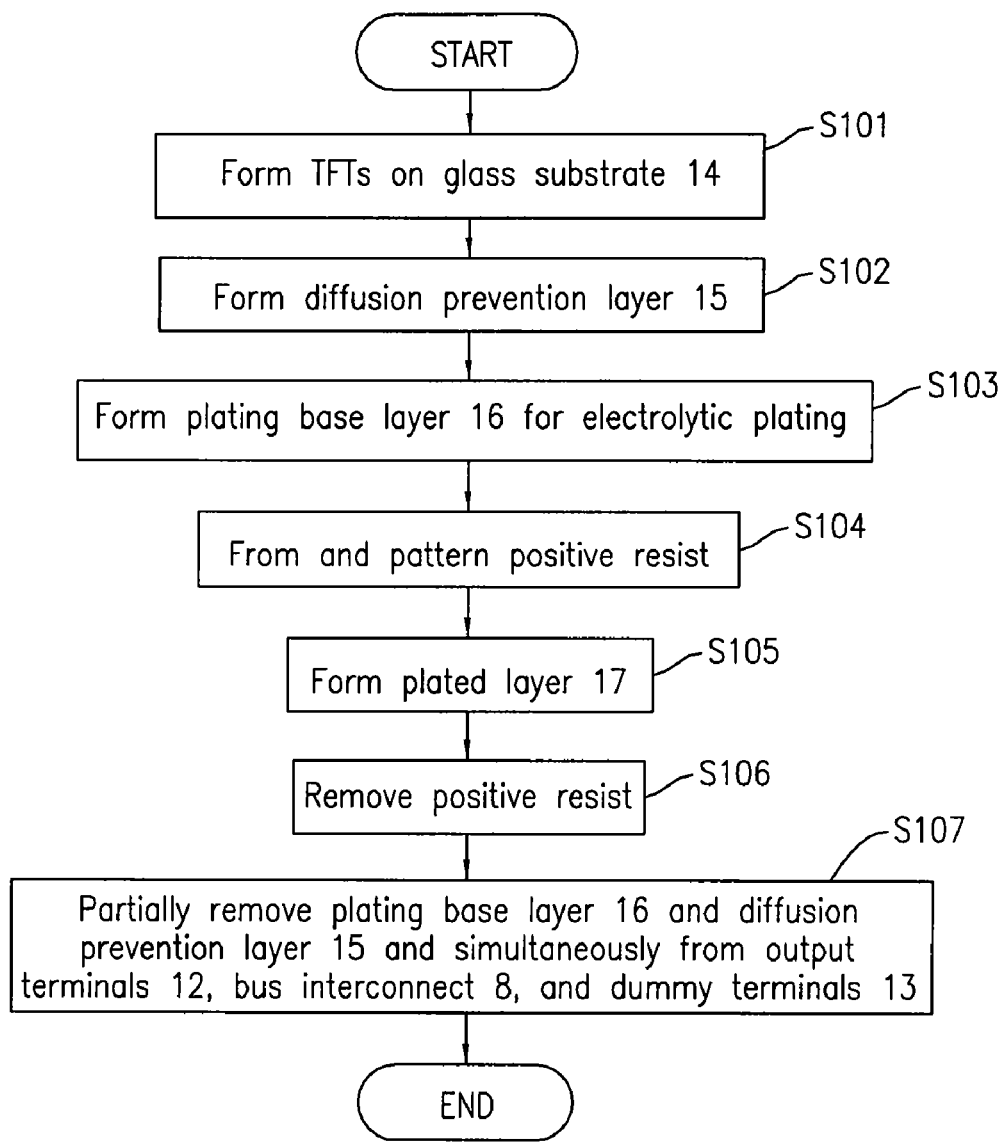
FIG. 5 is a flowchart of a method of manufacturing the semiconductor device shown in FIG. 3.

In step S101 shown in FIG. 5, TFTs of drive circuit units 7 (see FIG. 3) were formed on glass substrate 14 shown in FIG. 4. In step S102, diffusion prevention layer 15 made of Ti and W at a ratio of 10:90 were grown on glass substrate 14 to a thickness of 100 nm by sputtering. In step S103, plating base layer 16 of Au for electrolytic plating was grown on diffusion prevention layer 15 to a thickness of 300 nm by sputtering.

In step S104, the entire surface formed so far was coated with a positive resist layer (not shown) at a rotational speed of 700 rpm according to a spin-coating process. Thereafter, the positive resist layer was dried, exposed to light, and developed into a desired pattern. The positive resist had a film thickness of about 20 µm.

In step S105, plated layer 17 was formed on the exposed surface of plating base layer 16 to a thickness of about 17 µm in a jet plating apparatus using a noncyan plating solution. The plating solution had a temperature of 50° C., and the plated layer was grown at a rate of 0.25 µm/min. Variations (σ) in the thickness of produced plated layer 17 were ± about 5% within a substrate area having a size of 300 mm×300 mm.

After the plating process, the positive resist was removed in step S106. In step S107, unwanted plating base layer 16 in areas where plated layer 17 was not formed was removed according to a wet etching process using an etching solution including potassium iodide, and unwanted diffusion prevention layer 15 was removed according to a wet etching process using a mixed solution of aqueous hydrogen peroxide and ammonia.

As described above, diffusion prevention layer 15, plating base layer 16, and plated layer 17 were formed on glass substrate 14, and diffusion prevention layer 15 and plating base layer 16 were partially removed using plated layer 17 as a mask, thereby simultaneously forming output terminals 12, bus interconnect 8, and dummy terminals 13 which were constructed of those layers. In this manner, the semiconductor device shown in FIG. 3 was obtained.

Figure 6:
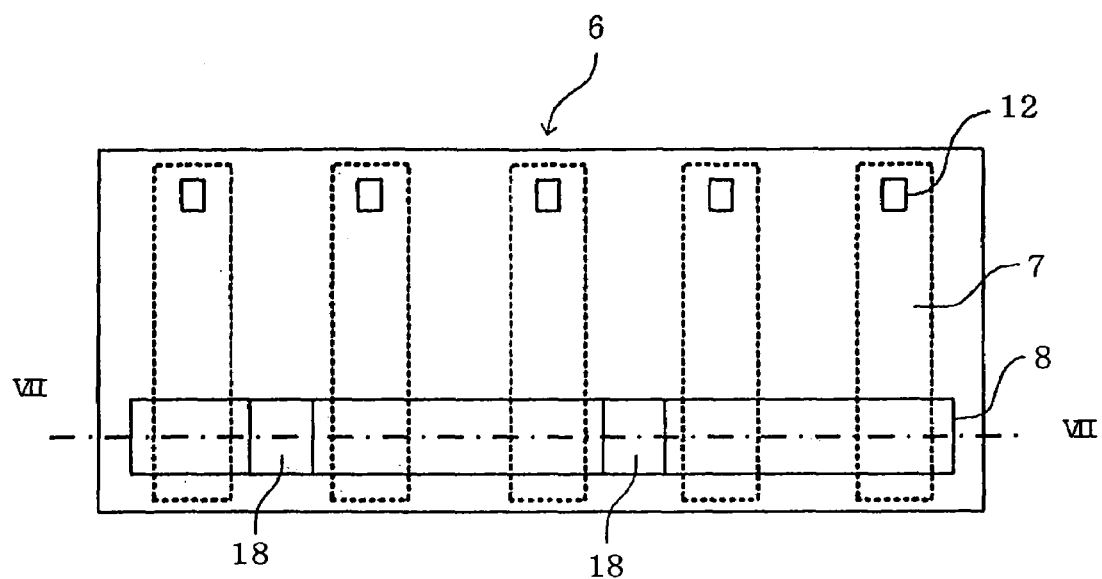
FIG. 6 is a plan view of a second example of the semiconductor device according to the present invention.
Figure 7:
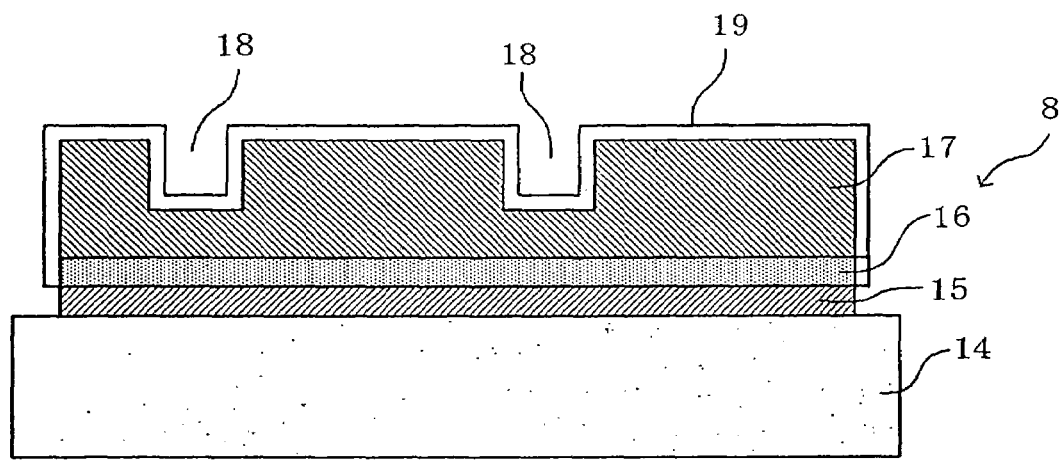
FIG. 7 is a cross-sectional view taken along line VII—VII of FIG. 6.

Second Example of Semiconductor Device:

FIG. 6 shows in plan a second example of the semiconductor device according to the present invention, which serves as part of the liquid crystal display apparatus shown in FIG. 1. FIG. 7 is a cross-sectional view taken along line VII—VII of FIG. 6. Those parts shown in FIGS. 6 and 7 which are identical to those shown in FIGS. 3 and 4 are denoted by identical reference numerals and will not be described in detail below.

The second example of the semiconductor device differs from the first example of the semiconductor device shown in FIGS. 3 and 4 as follows. First, bus interconnect 8 between adjacent two drive circuit units 7 has recesses 18 defined in at least portions thereof and having a bottom whose height from the surface of glass substrate 14 is lower than the height of the portion of bus interconnect 8 around recesses 18. Second, drive circuit units 7 have no dummy terminals. The third difference is that surface covering layer 19 is formed on the surfaces of bus interconnect 8 and output terminals 12.

Source driver semiconductor device 6 shown in FIGS. 3 and 4 has bus interconnect 8 having a flat upper surface substantially across the full width thereof. Therefore, depending on the type of the base resin material of the ACF, ACP, or NCP used to mount source driver semiconductor device 6 on TFT board 3, the base resin material is prevented from flowing by bus interconnect 8, and may form voids therein and may have a reduced filling ratio, possibly reducing the reliability with which source driver semiconductor device 6 is mounted on TFT board 3. According to the second example of the semiconductor device, however, since bus interconnect 8 between adjacent two drive circuit units 7 has recesses 18-defined in at least portions thereof, recesses 18 function as passages in which the adhesive (resin material) flows in the mounting process. Consequently, the formation of voids in the adhesive is reduced, and the filling ratio of the adhesive is increased, thus increasing the reliability with which source driver semiconductor device 6 is mounted on TFT board 3.

The number of drive circuit units 7 is 3072 as with the first example, but drive circuit units 7 are arrayed at a pitch of 69 µm. Low-resistance bus interconnect 8 was made of Cu (the volume resistivity at room temperature is $1.8 \times 10^{-8}$·m) and manufactured according to the electrolytic plating process. The required thickness of bus interconnect 8 when the width of bus interconnect 8 is 100 µm is about 8.6 µm or greater.

Figure 8:
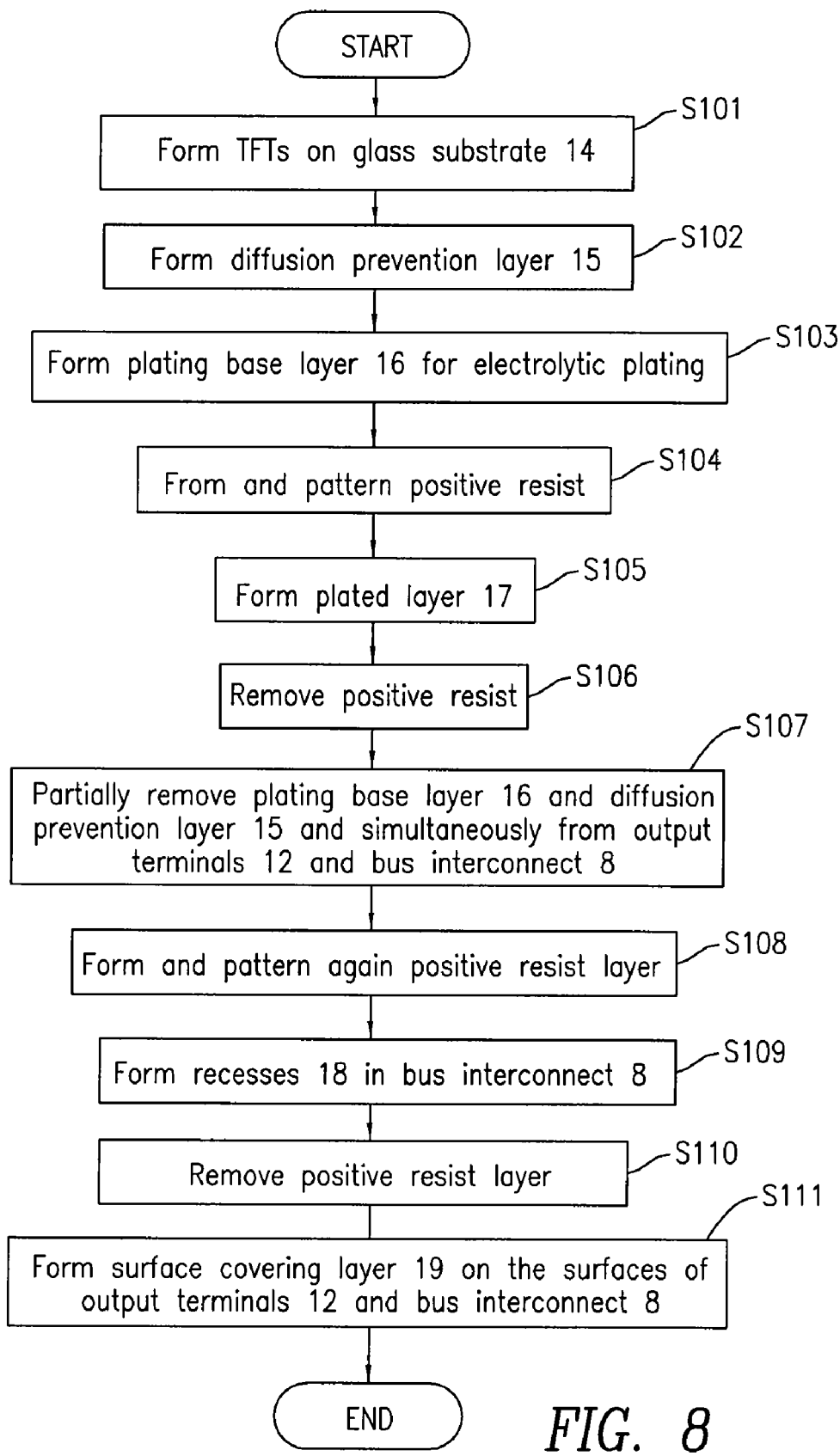
FIG. 8 is a flowchart of a method of manufacturing the semiconductor device shown in FIG. 6.

A method of manufacturing the semiconductor device shown in FIGS. 6 and 7 will be described below with reference to FIG. 7 and a flowchart shown in FIG. 8.

In steps S101 through S107 which are the same as those in the first example, TFTs of drive circuit units 7 were formed on glass substrate 14, and bus interconnect 8 having a flat upper surface and output terminals 12, which were constructed of diffusion prevention layer 15, plating base layer 16, and plated layer 17, were simultaneously formed on glass substrate 14. In the second example, diffusion prevention layer 15 comprised a Cr film having a thickness of 200 nm, plating base layer 16 comprised a Cu film having a thickness of 150 nm, and plated layer 17 comprised a Cu film. The plating solution comprised a plating solution of copper sulfate with a surface brightener added thereto. The plating solution had a temperature of 25° C. Unwanted plating base layer 16 was removed according to a wet etching process using an etching solution of potassium iodide, and unwanted diffusion prevention layer 15 was removed according to an ion milling process. Variations (σ) in the thickness of produced plated layer 17 were±about 7% within a substrate area having a size of 300 mm×300 mm. No dummy terminals were formed.

In step S108, the entire surface formed so far was coated again with a positive resist layer (not shown) at a rotational speed of 1000 rpm according to a spin-coating process. The positive resist layer had a thickness of about 15 μm. Then, openings each having a width of 55 μm were formed at a pitch of 276 μm in the positive resist layer between two adjacent drive circuit units 7, using a projection exposure machine.

Thereafter, in step S109, low-resistance bus interconnect 8 which is exposed in the openings in the positive resist layer was etched for about 8 minutes according to a wet etching process, using an etching solution of ammonium persulfate with 2 wt % of sulfuric acid added thereto, forming recesses 18 having a depth of 7 μm in low-resistance bus interconnect 8.

Then, in step S110, the positive resist layer was removed. In step S111, the entire assembly was immersed in an Au flash bath, forming surface covering layer 19 of Au on the surface layers of output terminals 12 and low-resistance bus interconnect 8.

In this manner, source driver semiconductor device 6 with recesses 18 defined in bus interconnect 8 as shown in FIG. 6 was obtained. It was confirmed that source driver semiconductor device 6 manufactured in this example suffered less voids in the adhesive when source driver semiconductor device 6 was mounted on TFT board 3, with the result that the bonding strength by which source driver semiconductor device 6 was bonded to TFT board 3 increased about 20%, compared with source driver semiconductor device 6 free of recesses 18 according to the first example shown in FIGS. 3 and 4.

The liquid crystal display apparatus has been described as a display apparatus in the above embodiments. However, the present invention is not limited to the liquid crystal display apparatus, but is applicable to any display apparatus insofar as they are of the active matrix type.

While preferred embodiments of the present invention have been described using specific terms, such description is for illustrative purposes only, and it is to be understood that changes and variations may be made without departing from the spirit or scope of the following claims.

What is claimed is:

1. A semiconductor device comprising:
a substrate;
a plurality of circuit units disposed on said substrate and including thin-film transistors, said circuit units having respective output terminals;
at least one bus interconnect for supplying a voltage to said circuit units; and
a power supply feed point for supplying a voltage from an external source to said bus interconnect;
wherein a pitch L (m) of said circuit units, a number N of said circuit units, and a resistance R (Ω/m) per unit length of said at least one bus interconnect are related to each other as follows:

$$R \times N^2 \times L \leq 4 \times 10^3.$$

2. A semiconductor device comprising:
a substrate;
a plurality of circuit units disposed on said substrate and including thin-film transistors, said circuit units having respective output terminals;
at least one bus interconnect for supplying a voltage to said circuit units; and
a power supply feed point for supplying a voltage from an external source to said bus interconnect;
wherein said circuit units include circuit units disposed on a left-hand side of said power supply feed point and remaining circuit units disposed on a right-hand side of said power supply feed point, and a pitch L (m) of said circuit units, a number N of said circuit units, and a resistance R (Ω/m) per unit length of said at least one bus interconnect are related to each other as follows:

$$R \times N^2 \times L \leq 16 \times 10^3.$$

3. A semiconductor device according to claim 1, wherein a height from a surface of said substrate to an upper surface of said output terminals is substantially equal to a height from the surface of said substrate to an upper surface of said bus interconnect.

4. A semiconductor device according to claim 2, wherein a height from a surface of said substrate to an upper surface of said output terminals is substantially equal to a height from the surface of said substrate to an upper surface of said bus interconnect.

5. A semiconductor device according to claim 1, wherein said bus interconnect has a plurality of regions having respective different heights from a surface of said substrate, and a height from the surface of said substrate to an upper surface of said output terminals is substantially equal to the maximum height from the surface of said substrate to an upper surface of said bus interconnect.

6. A semiconductor device according to claim 2, wherein said bus interconnect has a plurality of regions having respective different heights from a surface of said substrate, and a height from the surface of said substrate to an upper surface of said output terminals is substantially equal to the maximum height from the surface of said substrate to an upper surface of said bus interconnect.

7. A semiconductor device according to claim 1, wherein at least a portion of said output terminals and at least a portion of said bus interconnect are made of the same material.

8. A semiconductor device according to claim 2, wherein at least a portion of said output terminals and at least a portion of said bus interconnect are made of the same material.

9. A semiconductor device according to claim 1, wherein said circuit units have respective dummy terminals mounted on said substrate, and a height from a surface of said substrate to an upper surface of said dummy terminals is substantially equal to a height from the surface of said substrate to an upper surface of said bus interconnect.

10. A semiconductor device according to claim 2, wherein said circuit units have respective dummy terminals mounted on said substrate, and a height from a surface of said substrate to an upper surface of said dummy terminals is substantially equal to a height from the surface of said substrate to an upper surface of said bus interconnect.

11. A display apparatus comprising:
a semiconductor device according to claim 1; and
a display panel board on which said semiconductor device is mounted.

12. A display apparatus comprising:
a semiconductor device according to claim 2; and
a display panel board on which said semiconductor device is mounted.

* * * * *